United States Patent
Dymek

(10) Patent No.: US 10,234,485 B2
(45) Date of Patent: Mar. 19, 2019

(54) MEASURING ARRANGEMENT

(71) Applicant: KROHNE Messtechnik GmbH, Duisburg (DE)

(72) Inventor: Steffen Dymek, Oberhausen (DE)

(73) Assignee: KROHNE MESSTECHNIK GMBH, Duisburg (DE)

( * ) Notice: Subject to any disclaimer, the term of this patent is extended or adjusted under 35 U.S.C. 154(b) by 577 days.

(21) Appl. No.: 14/280,821

(22) Filed: May 19, 2014

(65) Prior Publication Data
US 2014/0347033 A1 Nov. 27, 2014

(30) Foreign Application Priority Data

May 22, 2013 (DE) .......................... 10 2013 008 598

(51) Int. Cl.
| | | |
|---|---|---|
| *G01R 19/00* | (2006.01) | |
| *G01L 21/00* | (2006.01) | |
| *G08C 19/02* | (2006.01) | |
| *H04Q 9/00* | (2006.01) | |

(52) U.S. Cl.
CPC .......... *G01R 19/0092* (2013.01); *G01L 21/00* (2013.01); *G08C 19/02* (2013.01); *H04Q 9/00* (2013.01)

(58) Field of Classification Search
USPC ............... 323/234, 282, 266, 271, 277, 281; 324/76.11, 609, 713, 123 R, 522; 702/65, 702/57, 64; 73/861, 357, 649, 861.08, 73/861.357; 361/18, 659, 679.01; 455/127.1
See application file for complete search history.

(56) References Cited

U.S. PATENT DOCUMENTS

| | | | |
|---|---|---|---|
| 6,304,108 B1 * | 10/2001 | Inn ..................... | H03K 17/0822 |
| | | | 327/543 |
| 6,577,989 B2 | 6/2003 | Florin | |
| 7,844,410 B2 | 11/2010 | Lalla | |
| 8,193,784 B2 | 6/2012 | Seberger et al. | |
| 8,310,088 B2 | 11/2012 | Kah et al. | |
| 9,243,932 B2 | 1/2016 | Schleith et al. | |
| 2007/0150547 A1 * | 6/2007 | Cook .................... | G01F 1/3254 |
| | | | 709/212 |
| 2008/0088286 A1 * | 4/2008 | Cho ........................ | G05F 1/56 |
| | | | 323/280 |

(Continued)

FOREIGN PATENT DOCUMENTS

| | | | | |
|---|---|---|---|---|
| DE | 4210785 C1 * | 9/1993 | ........ | H02M 3/33523 |
| DE | 10 2006 030 962 A1 | 1/2008 | | |

*Primary Examiner* — Melissa J Koval
*Assistant Examiner* — Nasima Monsur
(74) *Attorney, Agent, or Firm* — David S. Safran; Roberts Mlotkowski Safran Cole & Calderon, P.C.

(57) ABSTRACT

A measuring arrangement for determining at least one measured variable with a sensor device (2), a signal outlet for outputting of an output signal and a current-adjusting device for adjusting the current of the output signal provides a measuring arrangement whose power consumption is at a maximum for preferably all states of operation. The object is obtained the measuring arrangement that a load current device and a regulating device are provided. Here, the regulating device controls the load current device based on a voltage drop via the current-adjusting device (4).

12 Claims, 2 Drawing Sheets

(56) References Cited

U.S. PATENT DOCUMENTS

| | | | | |
|---|---|---|---|---|
| 2008/0211313 A1* | 9/2008 | Nakamura | ................ | G05F 1/56 |
| | | | | 307/75 |
| 2010/0045268 A1* | 2/2010 | Kilian | .................... | H03K 19/18 |
| | | | | 324/207.2 |
| 2011/0080152 A1* | 4/2011 | Luzzi | ................. | G06K 19/0723 |
| | | | | 323/299 |
| 2011/0103112 A1* | 5/2011 | Jiang | ................. | H02M 3/33507 |
| | | | | 363/125 |

\* cited by examiner

MEASURING ARRANGEMENT

BACKGROUND OF THE INVENTION

Field of the Invention

The invention relates to a measuring arrangement for determining at least one measured variable. The measuring arrangement has at least one sensor device, at least one signal outlet for output of at least one output signal and at least one current-adjusting device for adjusting the current of the output signal.

Description of Related Art

The above-mentioned measured variable can be, for example, the flow, the fill level, the pH, the electric conductivity or the temperature of a medium. The output signal is preferably a current signal, so that the output signal carries information about the value of the measured variable or a state of the measuring arrangement in the form of current. The output signal is thus, in particular, a so-called 4 . . . 20 mA signal. The measuring arrangement is, for example, a field or measuring device for use in the field of process automation. Alternatively, the measuring arrangement is a combination of separately designed components.

In modern process automation, different measuring devices are used as so-called field devices for determining or monitoring of measured variables in order to be able to correspondingly monitor or control processes. Such measuring devices are partially designed as compact units or have individual, separate components that are connected to one another for the transfer of information or, respectively, energy.

In principle, such measuring arrangements have at least one sensor device that is used for the actual determination of the measured variable and frequently generates an often-electric primary signal mostly dependent on the measured variable. The actual value of the measured variable can be determined from the primary signal or a variable derived therefrom. This occurs partially in the measuring arrangement itself or in a higher-ranking unit, for example a control room. In order to obtain the value of the measured variable, calibration data on file, for example, are necessary or different primary signals are allocated. In fill level measurement according to the radar principle, the fill level of the medium reflecting the microwave signals is determined from the running time of a microwave signal using reference data—in particular, using the distance between an antenna used for the measurement and the tank in which the medium is located.

The functional section for obtaining the value of the measured variable or for processing or transforming the primary signal, which is thus subordinate to the sensor device and which generates an output signal to be emitted via the signal outlet, is also called a transmitter, in particular in such measuring arrangements that have separate or separable components.

Normally a signal outlet, e.g., in the form of an interface, is provided for the output of the measured value or the primary signal of the sensor device or a variable dependent thereupon or also for the output of information about the state of the measuring arrangement in the form of error signals.

The output signal is, for example, analog or digital. The use of so-called 4 . . . 20 mA signals is common in process automation. Here, the current of the output signal—between 4 mA and 20 mA—is used as a carrier for information to be transmitted, in that, for example, the smallest current is assigned to the smallest expected measured value and the largest current is assigned to the largest expected measured value. A linear assignment between current and measured value is often used between these limiting values. In order to signal a state of error, output signals outside the 4 to 20 mA range are generated.

So-called two-wire devices are known for reducing the effort in wiring and also for designing the measuring arrangement or the field device. Only two wires are provided in these field or measuring devices, so that data communication and energy supply of the device take place using the same wire. Thus, in such devices or arrangements, the signal outlet and the current input coincide. Since the output signals lie between 4 mA and 20 mA, respectively only one corresponding current and thus changing power is available to the field device. The power available for operation of the field device depends on the measured value. Thus, the electronics of the measuring arrangement or the control of the component is to be designed accordingly. Many measuring arrangements thus strive for the energy input to always be at a maximum in all states of operation—i.e. at all possible measured values.

The output signals according to the 4 . . . 20 mA standard are analog signals. The so-called HART (highway addressable remote transducer) standard is a variation in process measurement technology for making digital communication possible. Here, the digital signals are superimposed over the analog signals. If a measuring arrangement makes a signal output according to the HART standard possible, it is necessary that the signal outlet or current inlet has or represents a high input resistance.

The publication of the German Patent Application DE 199 25 943 A1 and corresponding U.S. Pat. No. 6,577,989 B2 show a measuring arrangement of like kind, which consists of a measured value detection part having a sensor device and a current-adjusting device, of a measured value evaluation part—i.e., a sort of transmitter—and a connection between the two. The current-adjusting device adjusts the current corresponding to the measured value, which occurs by direct control using the sensor device. Here, the current intake of the sensor device is controlled so that a voltage drop via the current-adjusting device is as small as possible.

The publication of the German Patent Application DE 10 2006 030 962 A1 describes field device electronics for two-wire devices. In the case that the energy available to the field device is not needed by the sensor device, the electronics serve to transform the excess energy into heat. Here, several partial currents within the field device are measured, consumers are shut down and the current to be transformed into heat is adjusted via a control element, which is also used for voltage limitation. The construction is overall very detailed, very complex and thus cost-intensive.

A circuit is described in the publication of German Patent Application DE 10 2008 062 815 A1 and corresponding U.S. Pat. No. 8,310,088 B2 with which excess electric energy is not used in a two-wire device, but is saved instead.

SUMMARY OF THE INVENTION

The primary object of the present invention is to provide a measuring arrangement whose power intake is at a maximum at as many states of operation as possible.

The measuring device according to the invention in which the above described and shown object is met, is initially and essentially wherein at least one load current device and at least one regulating device are provided. Here, the regulating device controls the load current device based on a voltage drop via the current-adjusting device.

In one design, the measuring device according to the invention is designed, in particular, as a two-wire device, so that the signal output is also used particularly for the energy supply of the measuring arrangement.

The current-adjusting device is used for adjusting the output signal in respect to current. In one variation, this occurs in that the current-adjusting device sets a variable portion of the current, which, in conjunction with a fixed portion—quasi offset—makes up the value of the current of the output signal to be adjusted, and in particular, depending on the measured value.

The regulating device controls a load current device depending on a voltage drop via the current-adjusting device. The load current device is, in particular, a device via which a load current can be discharged or can be dissipated into heat.

In one design, the current-adjusting device, the regulating device and the load current device components of the measuring arrangement are subordinate to the actual sensor device and, in an additional design, even combined into a so-called transmitter. In one design, the current-adjusting device is connected to a contact of the signal outlet.

As opposed to the prior art, only a voltage drop is determined or monitored for the control of the use of excess energy. A measurement of partial currents within the measuring arrangement as in the prior art is omitted. The internal voltage is also not limited.

In one design, only the voltage, in particular, is regulated via the current-adjusting device, so that this current-adjusting device or at least one component of the current-adjusting device does not achieve saturation.

In one design, the electric voltage is tapped on both sides of a transistor—as the essential component of the current-adjusting device in this design—each via a voltage divider (as an arrangement of electric resistance elements) and both voltages are compared to one another via an operation amplifier. A resulting deviation between the two voltage values—overall as measure for the voltage dropping via the current-adjusting device—is compensated in this design via a load transistor as part of the load current device. By using the voltage divider, there is no fixed voltage difference via the transistor of the current-adjusting device. The voltage difference increases easily to higher voltages at the signal outlet due to the divider conditions of the voltage divider—so-called clamp voltages.

The portion of the current that is not required by the sensor device is used by the load current device. Thus, the power consumption can always be at maximum regardless of the operating state—i.e., the value of the measured variable.

The control of the load current device in dependence on the voltage dropping via the current adjusting device occurs, in one design, as follows: If the voltage drop sinks via the current-adjusting device, the result is that the subsequent electronics and, in particular, the sensor device do not require all of the available current, but only a portion of it. Thus, the load current device is controlled in such a manner that its energy consumption increases. Inversely, if the voltage drop increases via the current-adjusting device, then more current is used by the sensor device and the current consumption is fittingly reduced by the load current device.

For the design in which the current-adjusting device has a transistor, such control has the advantage that this transistor is kept at standard operation and does not reach saturation. The goal of the latter is that the input resistance of the signal outlet, which coincides with the energy input in a two-wire device, remains at a correspondingly high predetermined value, so that the use of the HART protocol is possible for data communication.

In one design, the current-adjusting device and the load current device are switched in series and in an alternative or supplementary device the current-adjusting device and the regulating device are switched in parallel.

In another design, the current-adjusting device is controlled by at least one setting device in the sense that the current-adjusting device receives information from the setting device about which current of the output signal is to be set. Here, control is dependent on at least one value generated by the sensor device. This value is, in one design, in particular, the value of the measured variable to be determined and, in an alternative design, a value obtained from the sensor device during measurement, which results in the value of the measured variable to be determined after suitable processing.

In the previous designs, the sensor device generates a value that is possibly already the final value of the measured variable or possibly requires further evaluation and processing, e.g., in combination with calibration data. The setting device controls the current-adjusting device based on this value and thus sets the value of the current of the output signal.

The setting of the current occurs, in one design, in such a manner that the current of the output signal is the sum of the variable portion of the current-adjusting device and a fixed portion of an additional device for setting the current—a fixed-current adjusting device.

The setting device additionally monitors the output signal, in one design, and compares the current applied to the signal outlet and thus to the two wires/contacts/clamps of the measuring arrangement with the predetermined desired value of the output signal. Here, in one design, a sense resistance is used for reading back of the set current.

In one design, the setting device and the regulating device are designed in such a manner that they operate independently of one another. The regulating device thus, in particular, controls the load current device only depending on the voltage drop via the current-adjusting device and thus independent of the setting device and also in such a manner that the value of the sensor device is not transmitted to the regulating device. The setting device, in this design, receives the information via the output signal to be set from the sensor device and, based on this, controls the current-adjusting device. The regulating device, for its part, monitors the voltage drop via the current-adjusting device and, based on this, controls the load current device without being influenced by either the value from the sensor device or the setting from the setting device.

In one design, the load current device is at least partially designed as a current consumer. In this design, the load current device is used, in particular, for consuming electric energy that is not required or consumed, in particular, by the sensor device in the given operating state (i.e. the state with the respective determined value of the measured variable and dependent on the respective value of the current of the output signal). The consumption of quasi excess energy by the load current device is controlled depending on the voltage drop via the current-adjusting device.

In one design, the load current device has at least one transistor.

The design, in which the regulating device controls the load current device in such a manner that consumption of electric energy by the load current device increases at a sinking voltage drop via the current-adjusting device, is devoted to the type of control. Alternatively or additionally, the regulating device controls the load current device such that consumption of electric energy by the load current device sinks at increasing voltage drop via the current-adjusting device.

The design, which is provided with at least one fixed-current adjusting device that sets a predetermined fixed value for the current of the output signal, is devoted to the further measuring arrangement. In this design, the value of the current of the output signal results from the fixed value that is set by the fixed-current adjusting device and from a variable value that is set by the current-adjusting device.

The fixed-current adjusting device is used in one design, in particular, also as a starting current source in order to guarantee a basic operation of the measuring arrangement. This occurs, in particular, in case the current-adjusting device or, in particular, a transistor as component of the current-adjusting device cannot be controlled without already existing energy.

In one design, the current-adjusting device has at least one transistor. Here, the regulating device controls the load current device in such a manner that the transistor of the current-adjusting device does not reach saturation. In this design, attention is paid that the transistor does not reach saturation and would, thus, no longer be controllable.

The design with a transistor in the current-adjusting device can, in particular, be combined with the design in which the current-adjusting device and the load current device as consumers of electric energy are arranged in series. Saturation of the transistor is prevented by correspondingly controlling the load current device using the regulating device.

In one design, by preventing saturation, it is also guaranteed that the input resistance of the signal outlet always remains high and does not sink.

In a further design, the load current device is switched in parallel to the signal outlet and in parallel to the sensor device.

It is provided in one design that the sensor device is used for flow measurement according to the vortex principle. An alternative design provides for the measurement of the flow as a measured variable using a MID sensor device (magnetic-inductive flow sensor) or according to the Coriolis principle. Alternatively, the sensor device is used for fill level or spacing measurement according to the radar principle. Other measuring methods can also be implemented.

In detail, there are a number of possibilities for designing and further developing the measuring arrangement according to the invention as will be apparent from the following description of embodiments in conjunction with the accompanying drawings.

DETAILED DESCRIPTION OF THE INVENTION

Figure 1:
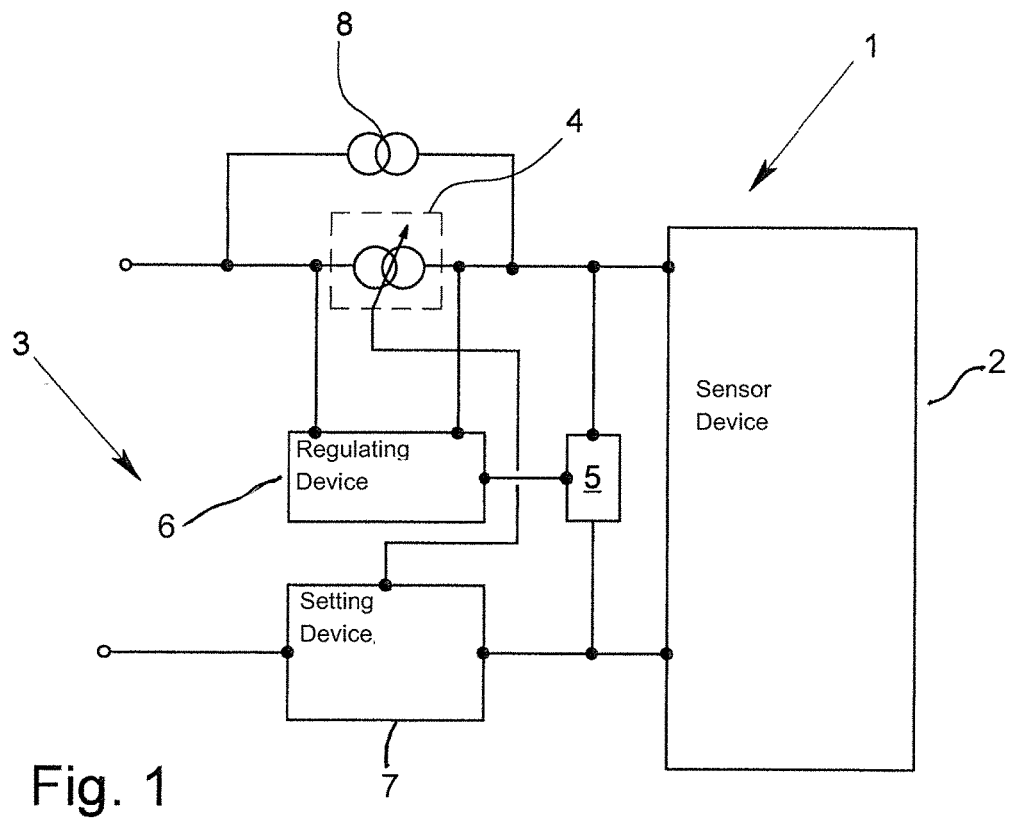
FIG. 1 is a schematic block diagram of a measuring arrangement essentially indicating functional interactions.
Figure 2:
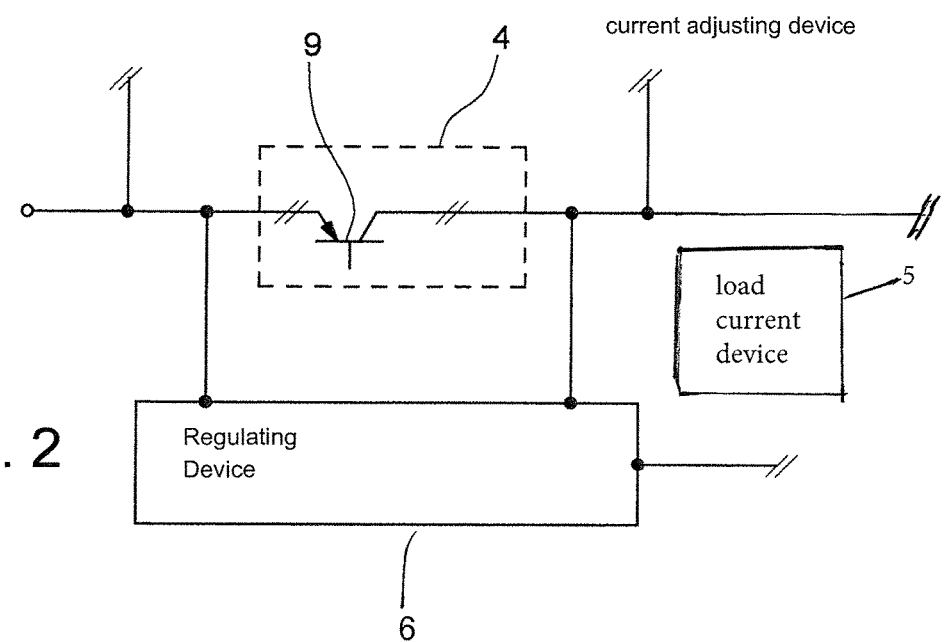
FIG. 2 is an expanded part of the measuring arrangement according to FIG. 1

An embodiment of a measuring arrangement 1 is shown in FIG. 1, wherein the figure is not a representation in the sense of a correct electric circuit diagram, but rather is an indication of the interactions between the different components of the measuring arrangement 1. FIG. 2 shows part of the measuring arrangement 1 of FIG. 1 and FIG. 3 additionally schematically portrays an example of a sensor device 2.

FIG. 1 schematically shows the construction of a measuring arrangement 1, which is designed here, in particular, as a compact, integrated field device. A sensor device 2 is provided for determining a measured variable, which, for example, is used for flow measurement of a medium capable of flowing through a tube.

The measuring arrangement 1 determines a value of the variable being measured and emits the value via the signal outlet 3 as a 4 . . . 20 mA signal. A classification between the current and the value of the measured variable is used here. Since a field device, as measuring arrangement 1, is designed as a so-called two-wire device in the illustrated embodiment, the signal outlet 3 is also simultaneously used as an input for electric energy.

Among other things, a current-adjusting device 4 is provided for setting the current of the output signal, and thus, finally, for outputting of the value for determining the measured variable.

In the measuring arrangement 1 according to the invention, the respective maximum available electric energy is obtained via the signal outlet 3 for each measured value, and thus, also for each operating state. At the same time, it is also guaranteed that the signal outlet 3 has the same high output resistance for each operating state, and thus, via the design of the signal outlet 3. This allows for data communication using the HART standard to also be carried out via the signal outlet 3.

In the illustrated embodiment, a load current device 5 is arranged in series with the current-adjusting device 4 for these characteristics of the measuring arrangement 1. The load current device 5 is essentially used for consuming excess electric energy—i.e., in particular, energy not required by the sensor device 2—and for example, transforming it into heat. Here, the load current device 5 is switched in parallel to the sensor device 2. In one embodiment, at least one transistor—not shown here—is provided as a part of the load current device 5.

The measure of the electric energy to be dissipated e.g., into heat by the load current device 5 is based on the voltage drop via the current-adjusting device 4. The monitoring of the voltage drop and the control of the load current device 5 based thereupon occurs using the regulating device 6. In one embodiment, two voltages—one before and one after the current-adjusting device 4 or at least one component of the current-adjusting device 4—are each measured via a voltage divider—not shown here—in order to obtain a value for the voltage drop via the current-adjusting device 4. Both voltages are then compared to one another via an operation amplifier—not shown here—wherein the load current device 5 is suitably adjusted in the case of deviation.

The current-adjusting device 4 is controlled by the setting device 7, which obtains a value from the sensor device 2 that is transmitted via the output signal. The portion of the current that is set by the current-adjusting device 4 is a variable portion, which together with a fixed portion—provided by the fixed-current adjusting device 8 arranged parallel to the current-adjusting device 4—makes up the current of the output signal, which is associated with the value of the sensor device 2, and thus, in the illustrated embodiment, is also, in particular, associated with the value of the measured variable.

A minimum current is also simultaneously given by the fixed-current adjusting device 8, which allows for a start-up of the electronics of the measuring arrangement, since current is required for operating the current-adjusting device.

The regulating device 6 and the setting device 7 are designed separately from one another and the value of the sensor device 2 also does not reach the regulating device 6. The regulating device 6 monitors only the voltage drop via the current-adjusting device 4 and also controls the load current device 5 only depending on this voltage drop.

FIG. 2 shows that the current-adjusting device 4 has at least one transistor 9. If the voltages are determined in front of and behind this transistor 9 and if, in the case of deviation of the voltages, the respective reasonable amount of energy is consumed by the load current device 5, then, in particular, the transistor 9 can be prevented from reaching saturation.

Figure 3:
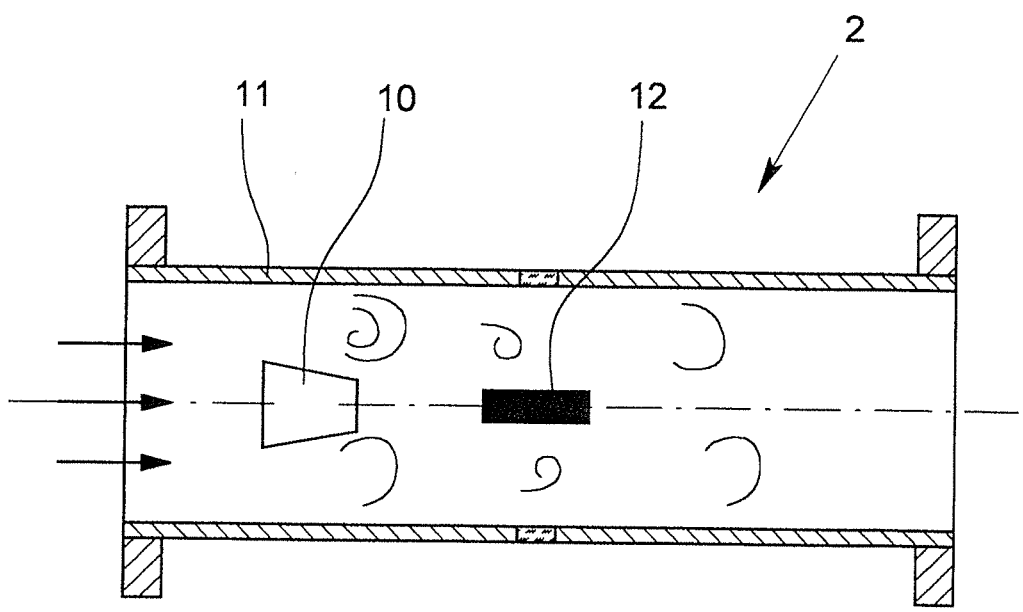
FIG. 3 is a cross-sectional view of a sensor device for use in the measuring arrangement according to FIG. 1.

FIG. 3 shows a vortex flowmeter for media capable of flowing (indicated by the arrows) as an example of a sensor device 2. The measuring principle of such measuring devices is based on so-called Karman vortex streets being formed in a medium capable of flowing behind a bluff body 10, which has medium flowing around it in a measuring tube 11, which form vortices that are shed from the bluff body 10 and move forward with the flow. The frequency at which the vortices are shed from the bluff body 10 is dependent on the velocity of flow, wherein the correlation is nearly linear under certain conditions. Thus, the flow velocity of the medium can be determined using the measurement of the vortices frequency with a recording unit 12.

What is claimed is:

1. Measuring arrangement for determining at least one measuring variable, comprising:
    at least one sensor device for determining the at least one measuring variable,
    at least one signal outlet for outputting of at least one output signal with information relating to a value of the at least one measuring variable determined by the at least one sensor device,
    at least one current-setting device for setting the current of the at least one output signal,
    at least one load current device for consuming excess electric energy supplied to the at least one sensor device which is not required by the at least one sensor device for determining the at least one measuring variable, and
    at least one regulating device,
    wherein the at least one regulating device controls consumption of the excess electric energy by the at least one load current device based on a voltage drop across the current-setting device which occurs during an operation of the current setting device of setting the current of the at least one output signal, and
    wherein the at least one sensor device is connected to the at least one signal outlet via said at least one current-setting device and said at least one regulating device.

2. Measuring arrangement according to claim 1, wherein the at least one current-setting device and the at least one load current device are connected in series.

3. Measuring arrangement according to claim 2, wherein the at least one current-setting device and the at least one regulating device are connected in parallel.

4. Measuring arrangement according to claim 1, wherein the at least one current-setting device and the at least one regulating device are connected in parallel.

5. Measuring arrangement according to claim 1, wherein at least one setting device is provided which controls the at least one current-setting device depending on at least one value generated by the at least one sensor device.

6. Measuring arrangement according to claim 5, wherein the at least one setting device and the at least one regulating device operate independently of one another.

7. Measuring arrangement according to claim 1, wherein the at least one load current device at least partially is adapted for consuming electric energy not consumed by the at least one sensor device.

8. Measuring arrangement according to claim 7, wherein the at least one regulating device controls the at least one load current device in such a manner that consumption of electric energy by the at least one load current device increases when the voltage drop across the at least one current-setting device decreases.

9. Measuring arrangement according to claim 7, wherein the at least one regulating device controls the at least one load current device in such a manner that consumption of electric energy by the load current device decreases when the voltage drop across the at least one current-setting device increases.

10. Measuring arrangement according to claim 1, wherein at least one fixed-current-adjusting device is provided which sets a predetermined fixed value for the current of the output signal, wherein the predetermined fixed value for the current is a minimum current value set to allow self startup of the measuring arrangement.

11. Measuring arrangement according to claim 1, wherein the at least one current-setting device has at least one transistor and that the at least one regulating device controls the at least one load current device in such a manner that the transistor remains below saturation.

12. Measuring arrangement according to claim 1, wherein the at least one load current device is connected in parallel to the at least one signal outlet and in parallel to the at least one sensor device.

* * * * *